United States Patent [19]

Shupe

[11] Patent Number: 4,578,649

[45] Date of Patent: Mar. 25, 1986

[54] RANDOM VOLTAGE SOURCE WITH SUBSTANTIALLY UNIFORM DISTRIBUTION

[75] Inventor: Chester D. Shupe, Mesa, Ariz.

[73] Assignee: Motorola, Inc., Schaumburg, Ill.

[21] Appl. No.: 697,991

[22] Filed: Feb. 4, 1985

[51] Int. Cl.[4] .................. H03B 29/00; G06F 7/00
[52] U.S. Cl. .................. 331/78; 331/149; 364/717
[58] Field of Search ............ 331/78, 149; 364/716, 364/717

[56] References Cited

U.S. PATENT DOCUMENTS

| | | | |
|---|---|---|---|
| 3,366,779 | 1/1968 | Catherall | 331/78 |
| 3,575,606 | 4/1971 | Bledsoe | 331/78 |
| 3,622,905 | 11/1971 | Brown | 331/78 |
| 4,095,192 | 6/1978 | Atkinson | 331/78 |

Primary Examiner—Eugene LaRoche
Assistant Examiner—G. Wan
Attorney, Agent, or Firm—Eugene A. Parsons

[57] ABSTRACT

A Gaussian noise generator having a sample and hold circuit connected to the output thereof for providing random voltage samples, a voltage controlled oscillator controlled by the random voltage samples and providing a linear 10 sawtooth output having a frequency dependent upon the amplitude of the random voltage samples, and a second sample and hold circuit connected to the oscillator to provide random voltage output samples with substantially uniform distribution between predetermined limits.

14 Claims, 4 Drawing Figures

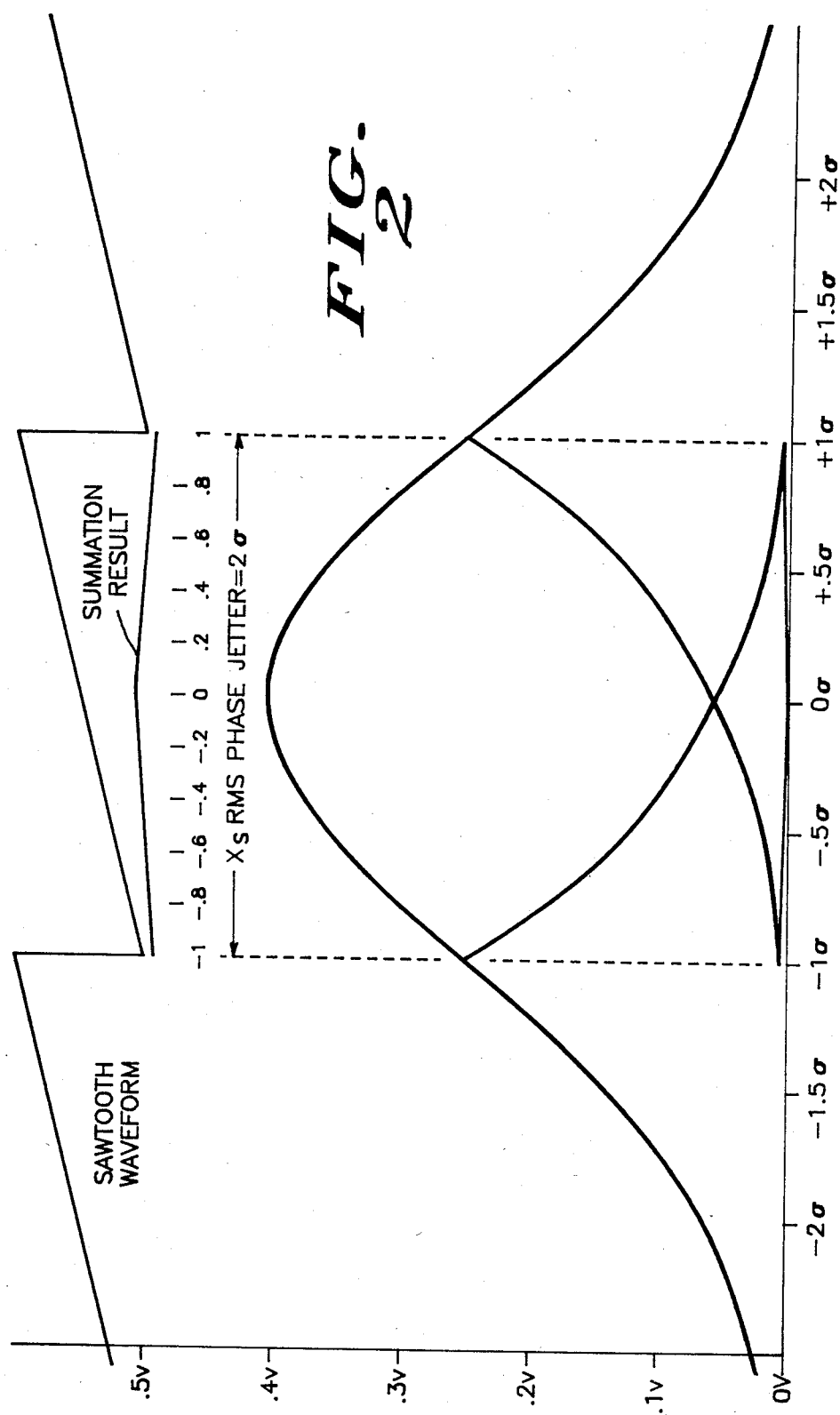

RANDOM VOLTAGE SOURCE WITH SUBSTANTIALLY UNIFORM DISTRIBUTION

A Gaussion noise generator having a sample and hold circuit connected to the output thereof for providing random voltage samples, a voltage controlled oscillator controlled by the random voltage samples and providing a linear sawtooth output having a frequency dependent upon the amplitude of the random voltage samples, and a second sample and hold circuit connected to the oscillator to provide random voltage output samples with substantially uniform distribution over a single sampling.

BACKGROUND OF THE INVENTION

The present invention pertains specifically to a random voltage source with uniform distribution. In general, a random voltage source is a source which provides samples of voltage at purely random amplitudes. The uniform distribution means that there is an equal probability of a signal falling within two limits but nothing appears beyond the limits.

Random voltage sources with uniform distribution are desirable in a variety of applications and especially, for example, in various radar applications where a random and uniformly distributed pulse repetition frequency (PRF) is desired.

SUMMARY OF THE INVENTION

The present invention pertains to a random voltage source with uniform distribution and includes a Gaussian noise generator having a sample and hold circuit connected to the output thereof for sampling the random noise at predetermined intervals and providing voltage samples having random amplitudes. The random voltage samples are applied to a sawtooth generator which produces a sawtooth shaped output signal having a frequency dependent upon the amplitude of the voltage samples applied thereto. The output signals from the sawtooth generator are sample by a second sample and hold circuit the output of which is random voltage samples having a substantially uniform distribution between a pair of limits determined amplitude of the sawtooth waveform.

It is an object of the present invention to provide a new and improved random voltage source with uniform distribution.

It is a further object of the present invention to provide a random voltage source with uniform distribution which is relatively simple to construct and manufacture.

It is a further object of the present invention to provide a random voltage source with a high uniformity of distribution in the resultant output signals.

These and other objects of this invention will become apparent to those skilled in the art upon consideration of the accompanying specification, claims and drawings.

BRIEF DESCRIPTION OF THE DRAWINGS

Referring to the drawings,

FIG. 2 is a graphical summation of the operation of the apparatus illustrated in FIG. 1.

DESCRIPTION OF THE PREFERRED EMBODIMENT

Figure 1:
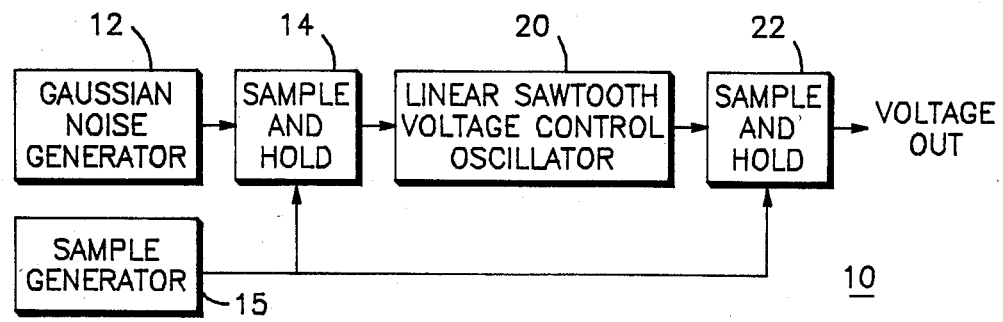
FIG. 1 is a simplified block diagram of a uniform distributed voltage generator incorporating the present invention.

Referring specifically to FIG. 1, a simplified block diagram of a uniform distributed voltage generator, generally designated 10, is illustrated. Voltage generator 10 includes a Gaussian noise generator 12 which supplies white noise the amplitude of which generally conforms to a Gaussian distribution curve to a sample and hold circuit 14. The noise generator 12 may be, for example, a standard noise diode and operational amplifier well-known in the art. The sample and hold circuit 14 may be any of the various well-known circuits with a signal input and a control input connected to receive timing signals thereon and to sample the signal input each time a timing signal is applied to the control input. In the present embodiment, the control input of sample and hold circuit 14 is connected to a sample generator 15 which provides the sample timing signals. The output of sample and hold circuit 14 is supplied to a control input for a linear sawtooth voltage controlled oscillator 20. The random voltage samples at the output of sample and hold circuit 14 control the frequency of oscillator 20 so that linear sawtooth signals are supplied at the output thereof with a random frequency corresponding to the random voltage samples supplied at the control input thereof. The output of oscillator 20 is connected to the signal input of a second sample and hold circuit 22, which is similar to sample and hold circuit 14. A control input sample and hold circuit 22 is connected to the output of sample generator 15. The output of sample and hold circuit 22 is the random voltage output of voltage generator 10.

Referring specifically to FIG. 2, a standard Gaussian distribution curve 25 is illustrated, which curve represents the probability density function for the amplitude of the random noise at the output of Gaussian noise generator 12. The amplitude of voltage samples produced by sample and hold circuit 14 also follow Gaussian distribution curve 25. The amplitude of the highest probability appears at the zero $\sigma$ and the amplitude decreases from there until 68% of the area 10 under the curve lies between $\pm 1\sigma$. As is well-known in the art, the curve continues out in either direction and approaches zero asymptotically. With the random voltage samples from sample and hold circuit 14 applied to the control input of voltage controlled oscillator 20, the frequency of oscillator 20 changes with each sample pulse, thereby randomizing the phase of oscillator 20. The tuning sensitivity of oscillator 20 is set so that the voltage sample of highest probability (0$\sigma$ deviation) produces a sawtooth voltage of the phase of waveform 26, with a normal distribution in that phase of $\pm 1\sigma$ and with a duration of 2$\sigma$, as can be seen from waveform 26 in FIG. 2. Sawtooth waveform 26 may also be the center or at rest frequency of oscillator 20. In this way the phase of oscillator 20 can deviate equally in either direction from the center or at rest frequency. The median operating frequency of oscillator 20 has a period of approximately $\pm 1\sigma$ such that its' sawtooth waveform extends approximately $\pm 1\sigma$. It can be shown that extending the waveform substantially beyond $\pm 1\sigma$ significantly degrades the uniformity of the output waveform.

The repetition rate of timing pulses from sample generator 15 are such that the period between timing pulses is approximately equal to the duration of a single sawtooth waveform 26. Thus, when the amplitude of a voltage sample supplied by sample and hold circuit 14 is at the highest probability oscillator 20 will be operating at the frequency illustrated by waveform 26 in FIG. 2. If the voltage sample has a greater amplitude the phase of oscillator 20 will be increased relative to the sample timing signal and if it has a lesser amplitude the phase of oscillator 20 will be decreased. Thus, it can be seen that the sawtooth signal produced in response to high amplitude voltage samples will trace through more than a single sawtooth waveform between samples, or timing signals, and sawtooth signals produced in response to lower amplitude voltage samples will trace through less than a single sawtooth waveform. In this fashion, the Gaussian distribution curve 25 is essentially folded back on itself when the phase of oscillator 20 is greater than $+1\sigma$, as illustrated by curve sections 28 and 29, and below $-1\sigma$ as illustrated by curve sections 32 and 33. By adding all of the points on the curves 25, 28, 29, 32 and 33 together within the $\pm 1\sigma$ limits, a summation probability density function 35 is developed. As can be seen from curve 35, the probability density function has a substantially uniform distribution between $\pm 1\sigma$. It should also be noted that no samples fall beyond the $\pm 1\sigma$ limits.

The uniformity of the summation density function can be calculated. The probability density function for Gaussian distribution function 25 is given by;

$$\Psi(X) = \frac{1}{\sigma(2\pi)^{\frac{1}{2}}} e^{\frac{-X^2}{2\sigma^2}}$$

where $\sigma$ is the standard deviation. The density of the resulting distribution is given by the expression;

$$Y(X) = \sum_{-n}^{+n} \frac{1}{\sigma(2\pi)^{\frac{1}{2}}} e^{\frac{-(nX+X_s)^2}{2\sigma^2}}$$

Where:
X = the inverse of the RMS one sigma phase jetter per sample period. (Example: X=2 on FIG. 2).
$X_s$ = starting phase of the integration relative to the waveform in cycles.
n = should be large enough so the expression x(n)≧4.

The integration can be visualized by geometrical summation 35 illustrated in FIG. 2. Gaussian distribution curve 25 represents the probability of sawtooth waveform 26 being at any given phase at the sample time. Sawtooth waveform 26 is shown at the phase of its highest probability. The RMS phase jetter in the example of FIG. 2 equals 0.5 cycles (X=2). The sampled voltage at the output of sample and hold circuit 22 equals a maximum 0.5 volts. It can be seen that the relative probability of obtaining a maximum voltage of 0.5 volts is the sum of the probability at zero, summed with the probability at ±2, ±4, etc. Thus, the summation has the effect of folding Gaussian curve 25 over itself and summing the overlapped sections.

The result of the summation, as shown in FIG. 2, is approximately a uniform distribution when X=2. Increasing the number of cycles (reducing x) which means the RMS random phase jetter, or variation, between cycles is even greater, will result in a distribution with greater uniformity. If calculations for various values of X are performed it will be seen that for values of X greater than 2 the uniformity starts degrading significantly.

Thus, a uniform distributed voltage generator is disclosed which provides random voltage samples uniformly distributed between a pair of predetermined limits. The uniform distributed voltage generator is relatively easy and inexpensive to construct since it is formed from common and easily obtained components. Further, the operating characteristics, including the limits and uniformity, can easily be changed by changing the repetition rate of the sample generator 15 or the range of frequencies produced by oscillator 20.

Figure 3A:
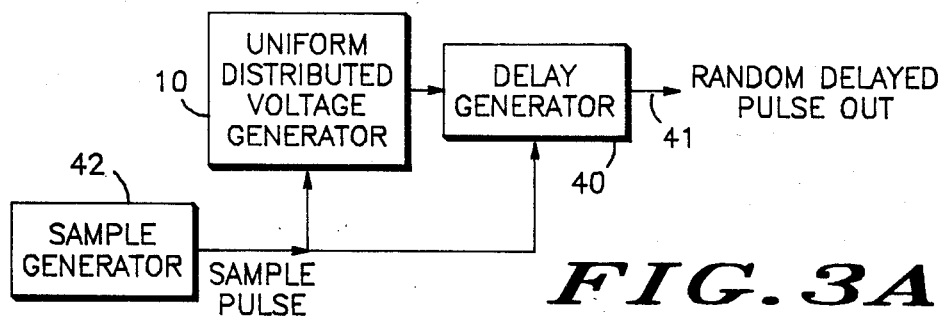
FIGS. 3A and 3B illustrate two typical applications of a uniform distributed voltage generator.

Referring to FIG. 3A, a typical use for the uniform distribute voltage generator 10 is illustrated. In this specific embodiment generator 10 supplies the random voltage pulses to a delayed generator 40 which supplies random delayed voltage pulses at an output 41. A sample generator 42 supplies timing pulses to the 2 sample and hold circuits in uforme distributed voltage generator 10 and to the delay generator 40. Thus, a pulse of random and uniform distributed delay is produced from an externally generated pulse (sample generator 42).

Figure 3B:
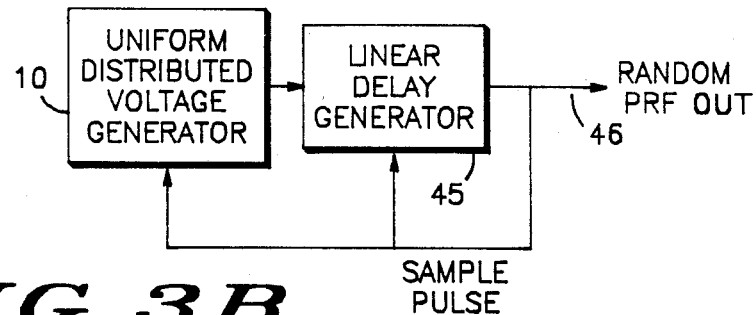

In FIG. 3B uniform distributed voltage generator 10 supplies random voltage pulses to a linear delay generator 45. Linear delay generator 45 provides voltage samples at an output terminal 46 which have a random pulse repetition frequency. These random voltage pulses are also applied to an input of uniform distributed voltage generator 10 and linear delay generator 45 as sample or timing pulses. This random and uniformly distributed pulse repetition frequency is utilized, for example, in radar and the like.

While I have shown and described a specific embodiment of a uniform distributed voltage generator and two different possible uses thereof, further modifications and improvements will occur to those skilled in the art. I desire it to be understood, therefore, that this invention is not limited to the particular form shown and I intend in the appended claims to cover all modifications which do not depart from the spirit and scope of this invention.

I claim:
1. A random voltage source with substantially uniform distribution comprising:
   a Gaussian noise generator providing an output;
   a first sample and hold circuit connected to receive the output from said Gaussian noise generator and provide random voltage samples at an output thereof;
   a voltage controlled oscillator having a control input and an output and providing a substantially sawtooth shaped signal at the output with a frequency dependent upon the voltage applied to the control input, the control input being connected to receive the random voltage samples from said first sample and hold circuit; and
   a second sample and hold circuit connected to the output of said voltage controlled oscillator and providing a random voltage output.
2. A random voltage source with substantially uniform distribution as claimed in claim 1 wherein the first and second sample and hold circuits are both controlled by the same source of timing pulses.
3. A random voltage source with substantially uniform distribution as claimed in claim 2 including delay means connected to receive the random voltage output from said second sample and hold circuit and provide timing pulses at an output, which timing pulses are connected to control both sample and hold circuits.

4. A random voltage source with substantially uniform distribution as claimed in claim 1 wherein the voltage controlled oscillator is a substantially linear sawtooth voltage controlled oscillator.

5. A random voltage source with substantially uniform distribution as claimed in claim 1 wherein said voltage controlled oscillator is constructed so that the application of a voltage sample of highest probability to the control input of said voltage controlled oscillator produces approximately the center frequency of said voltage controlled oscillator.

6. A random voltage source with substantially uniform distribution as claimed in claim 5 including in addition a source of timing pulses connected to control both said first and said second sample and hold circuits substantially together and with a frequency much less than the frequency of said voltage controlled oscillator.

7. A random voltage source with substantially uniform distribution comprising:
    a Gaussian noise generator providing random noise generally in accordance with Gaussian distribution probability at an output thereof;
    a first sample and hold circuit having a control input, a signal input connected to the output of said Gaussian noise generator and an output, said first sample and hold circuit being connected to provide random voltage samples at the output thereof in response to timing signals applied to the control input thereof;
    a linear sawtooth voltage controlled oscillator having a control input connected to the output of said first sample and hold circuit and an output, the output having sawtooth signals thereon with a frequency dependent upon the amplitude of the random voltage samples applied to the control input;
    a second sample and hold circuit having a control input, a signal input connected to the output of said voltage controlled oscillator, and an output, said second sample and hold circuit being connected to provide random voltage samples at the output thereof, the random voltage samples being distributed substantially uniformly between a pair of limits; and
    timing signal generating means, having an output connected to the control inputs of said first and second sample and hold circuits, for providing timing signals the spacing of which determines the pair of limits.

8. A random voltage source with substantially uniform distribution as claimed in claim 7 wherein the timing signal generating means is constructed to provide timing signals spaced apart a distance greater than approximately the length of a single sawtooth waveform at the center frequency of said voltage controlled oscillator.

9. A random voltage source with substantially uniform distribution as claimed in claim 8 wherein the voltage controlled oscillator is constructed so that the application of a voltage sample of highest probability to the control input of said voltage controlled oscillator produces approximately the center frequency of said voltage controlled oscillator.

10. A method of producing random voltage samples with substantially uniform distribution comprising the steps of:
    providing a Gaussian noise signal;
    sampling the Gaussian noise signal at predetermined intervals to provide voltage samples having random amplitudes with Gaussian distribution;
    providing a sawtooth shaped signal in response to the voltage samples, said sawtooth shaped signal having a frequency dependent upon the amplitude of the voltage samples; and
    sampling the sawtooth shaped signals at the predetermined intervals to produce random voltage samples with substantially uniform distribution.

11. A method as claimed in claim 10 wherein an approximately center frequency sawtooth shaped signal is produced in response to a voltage sample of highest probability in the Gaussian noise signal.

12. A method as claimed in claim 11 wherein the predetermined interval of the sampling steps is approximately greater in duration than a single sawtooth waveform at the center frequency.

13. A method as claimed in claim 10 wherein the sawtooth shaped signal provided is linear.

14. A method as claimed in claim 10 including the step of delaying the voltage samples with substantially uniform distribution and utilizing the delayed samples to time the two sampling steps.

* * * * *